US007277810B2

(12) United States Patent
Schumacher et al.

(10) Patent No.: US 7,277,810 B2
(45) Date of Patent: Oct. 2, 2007

(54) METHOD AND APPARATUS FOR AUTOMATING CALIBRATION OF TEST INSTRUMENTS

(75) Inventors: Richard P. Schumacher, Rancho Cucamonga, CA (US); Daniel S. Cook, Lenexa, KS (US); Winston Y. Chou, Pomona, CA (US); David G. Kinkade, Corona, CA (US); John B. Griffith, Irvine, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/175,800

(22) Filed: Jul. 5, 2005

(65) Prior Publication Data

US 2007/0010958 A1   Jan. 11, 2007

(51) Int. Cl.
*G01R 35/00* (2006.01)

(52) U.S. Cl. .................... 702/104; 702/85; 702/108; 702/119; 702/123; 714/39

(58) Field of Classification Search .............. 702/104, 702/38, 59, 85, 107, 106, 108, 117, 118, 119, 702/122, 123, 127, 185, 188
See application file for complete search history.

(56) References Cited

U.S. PATENT DOCUMENTS

| | | | | |
|---|---|---|---|---|
| 4,825,394 A | * | 4/1989 | Beamish et al. ............ 356/147 |
| 5,412,806 A | * | 5/1995 | Du et al. ....................... 707/2 |
| 6,167,401 A | * | 12/2000 | Csipkes et al. ............... 707/10 |
| 2003/0187864 A1 | * | 10/2003 | McGoveran ................ 707/102 |
| 2004/0249848 A1 | * | 12/2004 | Carlbom et al. ............ 707/102 |

* cited by examiner

*Primary Examiner*—Hal Wachsman
(74) *Attorney, Agent, or Firm*—Blakely Sokoloff Taylor & Zafman

(57) ABSTRACT

A calibration engine to eliminate disconnects between both manual and automated calibration procedures. It abstracts the process of procedure development such that procedure writers produce automated procedures without being computer programmers. By organizing calibration procedure elements in a relational database format, a relational automated calibration engine (RACE) provides the mechanism whereby a single calibration procedure is executed in either a manual, automated, or semi-automated fashion. The engine operates both with and without an installed operating system and relational database server. Interfaces ensure interoperability with other laboratory software elements such as scheduling, reporting, and measurement uncertainty.

7 Claims, 11 Drawing Sheets

DC VOLTAGE TESTS

> WARNING
>
> THE 5700AAN CALIBRATOR IS CAPABLE OF SUPPLYING LETHAL VOLTAGES. DO NOT MAKE CONNECTIONS TO THE [OUTPUT] TERMINALS WHEN ANY VOLTAGE IS PRESENT. PLACING THE INSTRUMENT IN STANDBY MODE MAY NOT BE ENOUGH TO AVOID A SHOCK HAZARD, SINCE THE [OPR/STBY] KEY COULD BE PRESSED ACCIDENTALLY. PRESS THE [RESET] KEY AND VERIFY THAT STBY IS DISPLAYED BEFORE MAKING CONNECTIONS TO THE [OUTPUT] TERMINALS.

1. Set the TI for V dc measurements and a 6 1/2 digit display by pressing the [DC V], [Shift], and [Auto/Man] keys.
2. Set the TI for automatic ranging by pressing the [Auto/Man] key until Man is not displayed.
3. Connect the calibrator (item Error! Reference source not found.) OUTPUT HI and LO terminals to the TI INPUT HI and LO connectors.
4. Set the calibrator output to the first setting listed in Table 1. Set the calibrator to the operate mode by pressing the [OPR/STBY] key.
5. Verify that the TI display indicates within the tolerance limits listed.
6. Set the calibrator to the standby mode by pressing the [OPR/STBY] key.
7. Repeat steps 4 through 6 using each remaining range and calibrator setting listed in Table 1

Table 1

| TI Range | Calibrator Setting (Nominal) | | TI Tolerance Limits | | |
|---|---|---|---|---|---|
| 100 mV | 100.000 0 | mV dc | 99.991 5 | to | 100.008 5 mV |
| 1 V | 1.000 000 | V dc | 0.999 953 | to | 1.000 047 V |
| 10 V | 10.000 00 | V dc | 9.999 60 | to | 10.000 40 V |
| 10 V | 5.000 00 | V dc | 4.999 77 | to | 5.000 23 V |
| 10 V | –5.000 00 | V dc | –4.999 77 | to | –5.000 23 V |
| 10 V | –10.000 00 | V dc | –9.999 60 | to | –10.000 40 V |
| 100 V | 100.000 0 | V dc | 99.994 9 | to | 100.005 1 V |
| 1000 V | 1,000.000 | V dc | 999.945 | to | 1000.055 V |

8. Set the calibrator for minimum output and standby operation by pressing the [RESET] key.

METHOD AND APPARATUS FOR AUTOMATING CALIBRATION OF TEST INSTRUMENTS

INCORPORATION BY REFERENCE

Incorporated-by-reference are Compact discs labeled Copy 1 and Copy 2, respectively. The following files are contained on each of the compact discs:

| File Name | Date of Creation | Byte Size |
| --- | --- | --- |
| DeviceCluster.pas | Feb. 26, 2007 | 4 KB |
| InterfaceToGui.pas | Feb. 26, 2007 | 7 KB |
| ResultsModule.pas | Feb. 26, 2007 | 2 KB |
| RTModule.pas | Feb. 26, 2007 | 8 KB |
| Sequencer.pas | Feb. 26, 2007 | 18 KB |

BACKGROUND OF THE INVENTION

A large existing library of calibration procedures currently exist in many organizations. These procedures represent a significant investment in Metrology engineering. Providing a mechanism to migrate these procedures forward is critical due to the significant cost associated with redeveloping them for use on different platforms.

Within existing Metrology procedures libraries, it is not uncommon to find as many as five different procedures which support the same test instrument. This has historically been required due to differences in the standards available at the various supporting laboratories. Where automation is available, it typically exists as an additional approved procedure in this library. This invites disconnects in the level of service provided by different procedures for the same test instrument. These disconnects marginalize the analysis of calibration and reliability data which is used in both calibration interval and uncertainty data analysis. Further, when problems are found in one procedure, it is required to determine whether the other procedures, which support the test instrument, are also adversely affected. This adds cost to maintaining the calibration procedure library.

The individuals who write calibration procedures (metrology engineers) are not computer programmers. While some of these procedure writers do have computer programming skills, there is a significant cost associated with training the entire procedure writing staff to work with a computer programming language which becomes unnecessary when the present invention is utilized.

Existing technical agent databases contain detailed information regarding which procedures and standards are approved for use at which locations of an organization, as well as calibration and maintenance intervals for all test equipment found throughout an organization.

The ability to collect parametric data on each calibration event and up-line this data is necessary to ensure that an audit trail can be established and that the completion of an organization's data collection tool can take place without the need to double key the results.

In a fully deployed mode of the invention, depending on the organization, several thousand workstations may be required to support the calibration activity performed across the organization. The costs and logistics associated with keeping these workstations current with the latest approved procedures, software, and operating system patches, is significant.

Technology, and particularly computer related technology, is advancing at a rapid pace. Dependence on existing hardware, software, and operating systems would undermine the value of any proposed solution if such elements were no longer available in the future. Protecting against obsolescence by anticipating the need to forwardly migrate calibration procedure elements is a key design element. For these reasons, organization of the calibration procedure elements in a relational database structure provides a mechanism to make systematic changes across existing data without having to recreate these elements.

SUMMARY OF THE INVENTION

The invention is directed to a relational automated calibration engine (RACE) implemented using a database structure that includes a relational arrangement of calibration procedure elements including all required instructions, setups, figures, test points and tolerances. It includes low-level data bus commands required for each instrument in the test setup. It can utilize, but does not require, a relational database server. This engine executes calibration and provides the ability to up-line the results. It does not seek to perform any laboratory management function.

RACE has corresponding sequencer software, which executes calibration procedures elements in automated, semi-automated, and manual modes. The sequencer can run under multiple operating systems. It supports standard substitution at runtime. Operators are provided a list of acceptable standards based upon the availability at their location.

The sequencer software is constructed so that it can run on inexpensive commercial off the shelf computers with little to no maintenance required to keep these systems current. By using a customized version of the Linux operating system, the same version of RACE can operate in a networked and non-network mode, even where no hard drive is present in the controller.

BRIEF DESCRIPTION OF THE DRAWINGS

FIG. 5 illustrates a calibration procedure for a digital multimeter.

FIG. 7 is a screen shot showing calibration voltage changes for each loop of the REPEAT procedure action.

DETAILED DESCRIPTION OF THE INVENTION

The present invention recognizes the need to support instruments on newer bus architectures. While existing calibration standards and test equipment inventory is overwhelmingly based upon the IEEE 488(GPIB) architecture, manufacturers are increasingly utilizing newer protocols such as IEEE 1394(Firewire), USB, and Ethernet interfaces in lieu of the more traditional 488 bus. Embedded instruments that utilize VXI and PXI back planes are also increasing rapidly in the test equipment serviced.

Existing instrument calibration procedures (ICPs) typically detail the performance parameters and test equipment required to calibrate the item.

ICPs utilize a limited set of action verbs, which have consistent meanings. In fact, ensuring the proper use of verbiage is part of the quality assurance process that each procedure undergoes before it is released. The types of actions usually found to be most common are: SET, ENSURE, VERIFY, CONNECT, REPEAT, VERIFY, CALCULATE and RECORD. It is these action verbs that would become the action types used by a procedure writer to describe a step when writing a procedure.

Current procedures set the state of all required equipment to some known state at the beginning of each section. By mimicking this process, the present invention uses an architecture which does not require the tracking of the state of each piece of equipment between steps. This greatly reduces the complexity of the required architecture.

Written ICPs utilize tables for repeated measurements. Where they are needed, the existing ICP has the operator perform a sequence of steps and then repeat the steps using the values in the table.

Automated calibration may require several commands to perform what can be accomplished in a single step manually (or vice versa). There exist some elements in a procedure, which cannot be accomplished by automation. For this reason, the invention is capable of operating seamlessly in automatic or manual mode.

The invention is implemented using a sequencer which is a computer program which executes a calibration procedure on a workbench. It was written using Borland's Kylix 3 product in the Delphi language. This allows the software to run under both Microsoft Windows as well as the Linux operating system without having to maintain separate development paths to do so. The source code is simply compiled twice, once under each operating system.

Figure 1:
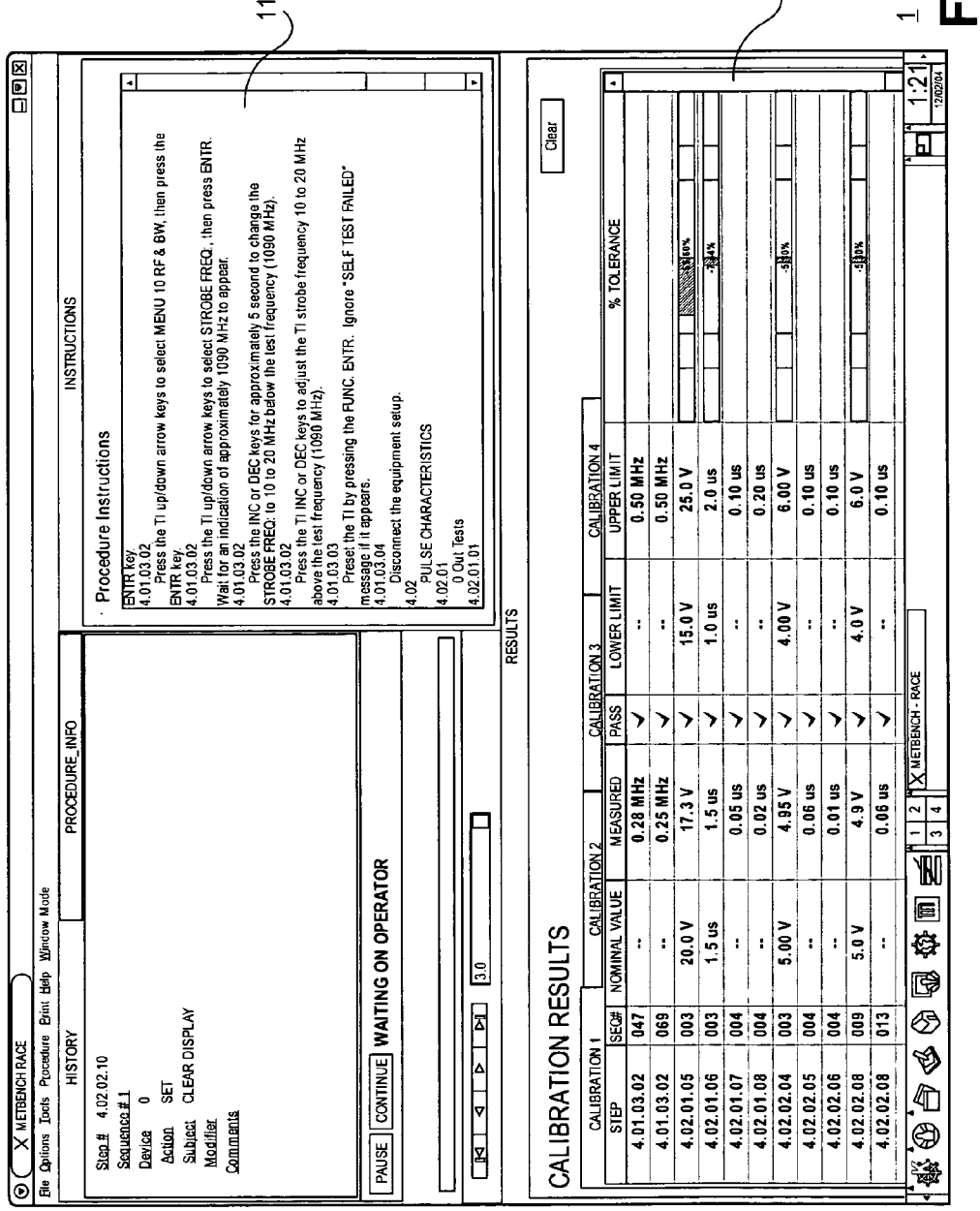
FIG. 1 is a screen shot showing a display of the RACE sequencer.

As shown in FIG. 1, the RACE sequencer walks the technician through the calibration procedure via procedure instructions 11, providing a single path through the procedure. During the initial setup, the technician interacts with the sequencer to indicate which standards he or she will use. The sequencer then determines whether each of these standards is an automated or a manual device and stores this information for later use.

During execution of the calibration procedure, the sequencer interprets each line of the calibration procedure. It displays connection messages and figures 13 as appropriate. When the state of either the unit under test or one of the standards needs to be changed, the sequencer looks up the appropriate command and formats the instruction as a low level bus command, in the case of an automated standard, or as English text displayed to the user in the case of a manual device.

Each command sent to an instrument is recorded in a log file, which can later be used for quality assurance purposes.

When the procedure requires the evaluation of a test point to a given tolerance, the sequencer performs all necessary calculations and renders the result to the screen.

Results are formatted according to the rules specified by the procedure writer during development. Raw results with no rounding or formatting are maintained in the results file to facilitate more detailed analysis.

Care is taken to "preset" all instruments used in the current section to a known state prior to execution. The preset may be as simple as performing the manufacturer's preset on an instrument or may be as complex as setting each parameter on the device.

The sequencer utilizes several algorithms to allow more complex functionality such as an adjust routine (i.e. adjust standard A until standard B indicates a certain value). Curve fit algorithms are used by the sequencer to perform these adjustments to ensure that the target value is rapidly obtained. Safety limits specified by the procedure writer ensure that damage to equipment or injury to personnel is avoided should the results go outside these limits.

Calibration jobs can be suspended and resumed without the need to start from the beginning. This is especially important for complex instruments for which the calibration may span across multiple workdays.

While the sequencer's main role is to perform calibration, RACE alignment procedures have been developed. These routines capitalize on the fact that the instrument bus commands are already in the database structure. The use of automated alignment will likely increase in the future as more manufacturers are storing calibration correction constants in their equipment rather than utilizing traditional analog components such as potentiometers.

The present invention uses a modular software design. Modularity minimizes interdependencies between software units and makes the program maintainable. This ensures that improvements can be made without compromising the integrity of the program. It also facilitates a team development approach, as it requires well-defined interfaces.

Figure 2:
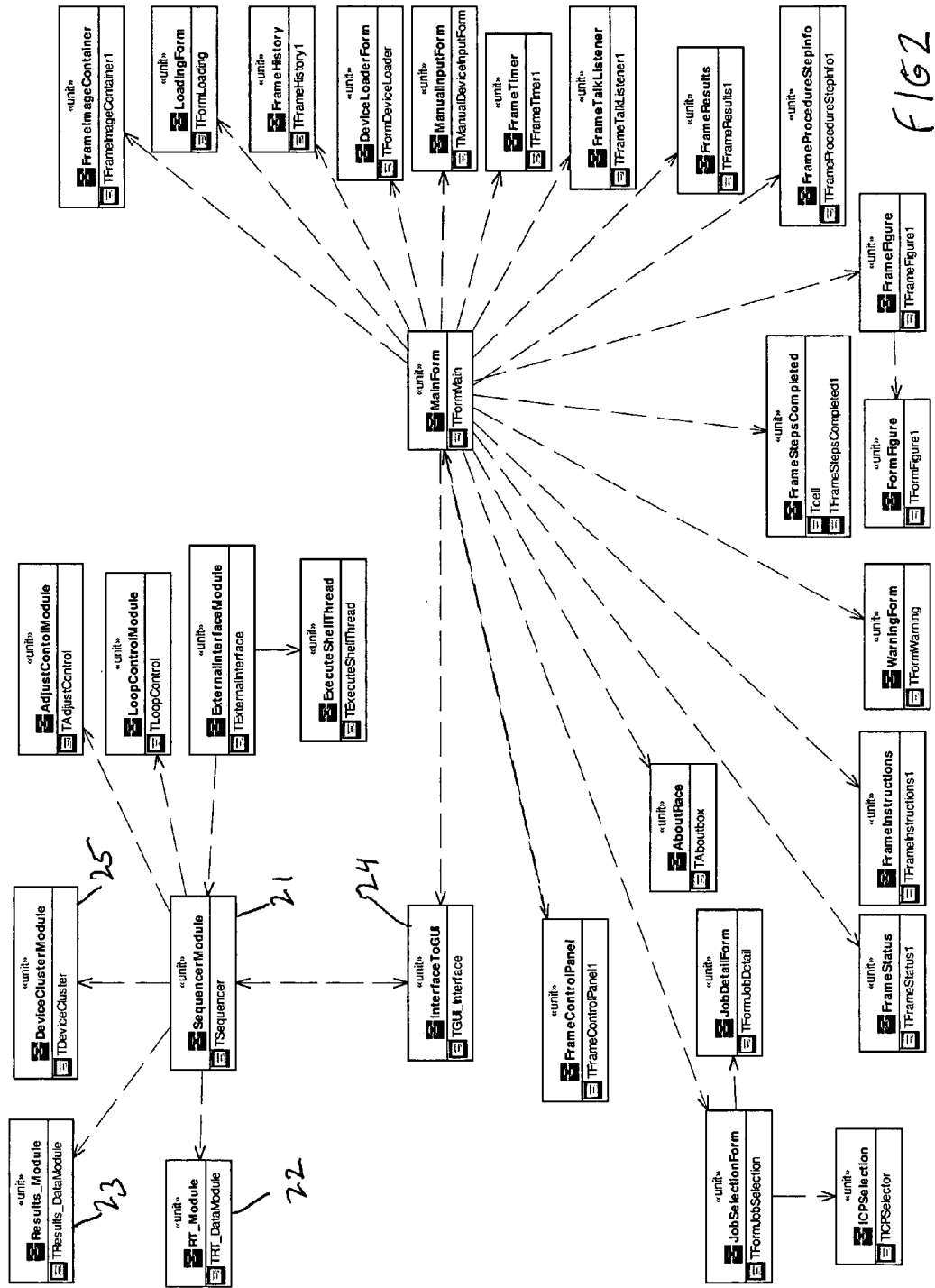
FIG. 2 is a RACE sequencer Uniform Modeling Language (UML) diagram.
Figure 3:
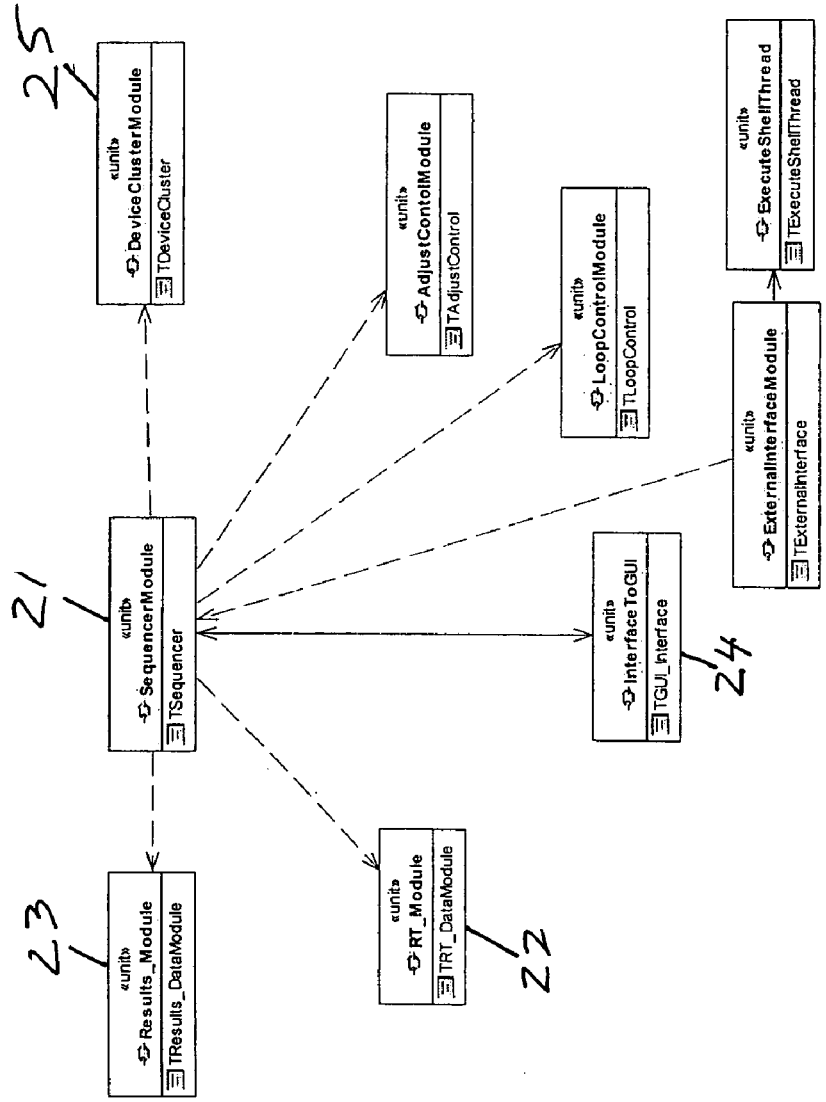
FIG. 3 is a UML diagram showing non-visual elements of the sequencer.
Figure 4:
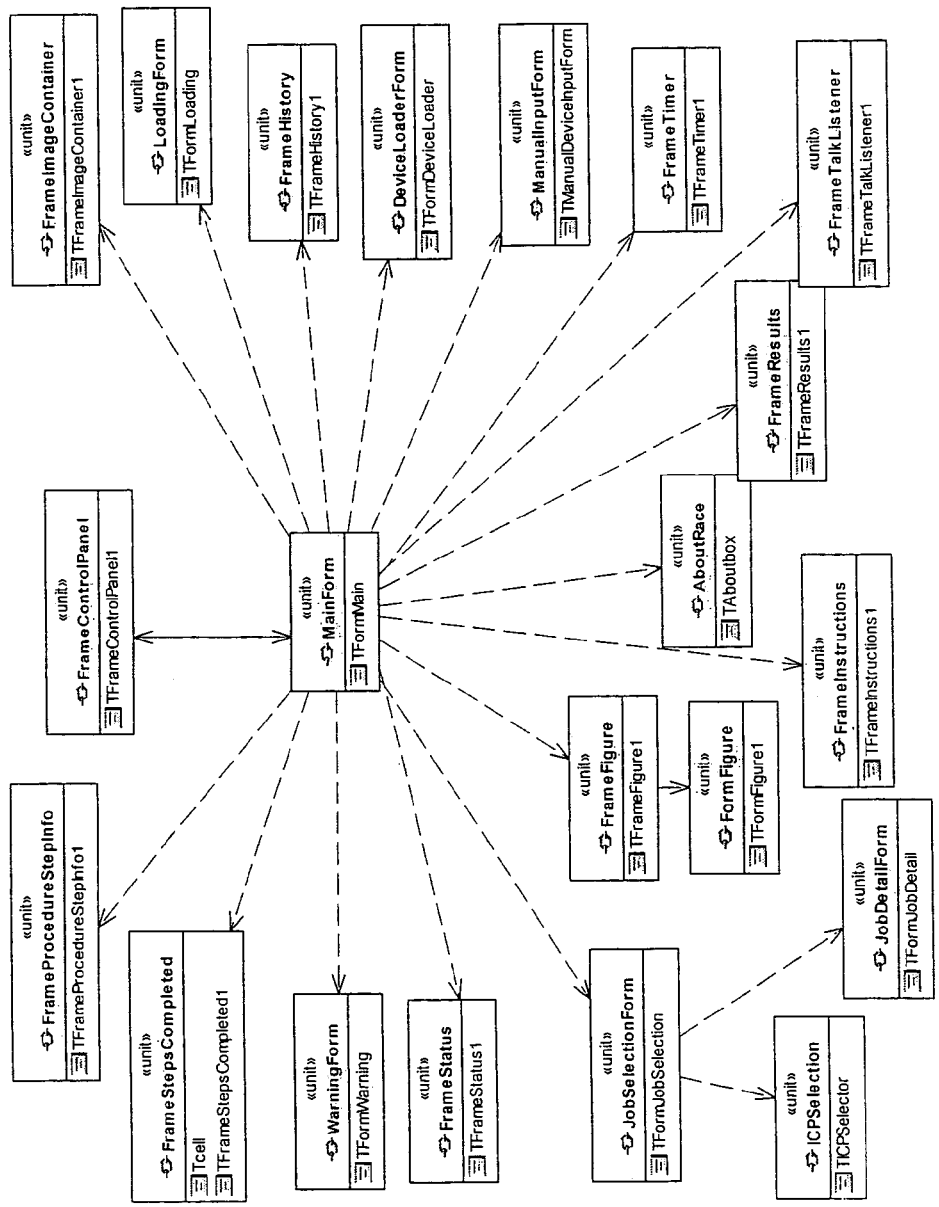
FIG. 4 is a UML diagram showing visual elements of the sequencer.

FIGS. 2 to 4 are Unified Modeling Language (UML) diagrams. Each software unit is shown in a rectangle, and unit dependencies are denoted using arrows. The sequencer software has been engineered to ensure that mutual dependencies are minimized.

Different organizations require different ways of performing calibration activities. For example, one organization may allow the user to re-sequence the order in which a test can run, whereas another may not. Another may wish to capture multiple measurements on each test point. The sequencer's behavior can easily be modified to accommodate these differences without the need to recompile the code. The use of a policy table accomplishes this. At runtime, the sequencer checks the policy table to determine which actions are appropriate. This feature expands the flexibility of the software and ensures that the development effort is not forked due to a specific user's needs.

The modules used to implement the invention are, with reference to FIG. 2, SequencerModule 21, RT_Module 22, Results_Module 23, InterfaceToGUI 24 and DeviceClusterModule 25. The remaining modules perform functions such as providing the graphic user interface, status indication, displaying and updating results. The implementation details of these remaining modules are not necessary for a complete understanding of the invention.

Each of these modules may be implemented in software written using the Delphi programming language. Extensively commented modules follow from which a person skilled in the art would be able to code a complete system according to the invention.

An implementation of SequencerModule 21 is the code segment entitled Sequencer.pas.doc contained on compact disc 1.

An implementation of RT_Module 22 is the code segment entitled RTModule.pas.doc contained on compact disc 1.

An implementation of Results_Module 23 is the following code segment entitled ResultsModule.pas.doc contained on compact disc 1.

An implementation of InterfaceToGUI module 24 is the following code segment entitled InterfaceToGUI.pas.doc contained on compact disc 1.

An implementation of DeviceClusterModule 25 is the following code segment entitled DeviceCluster.pas.doc contained on compact disc 1.

The invention utilizes a graphical user interface (GUI) to interact with the operator. As the UML diagram in FIG. 4 illustrates, the GUI is separated from other elements of the program through a well-defined interface. The GUI has been constructed to allow operation under various screen resolutions. Individual elements are handled using frames, which can be "snapped" together to allow the user to customize which elements are shown, and how they are displayed. This approach provides tremendous flexibility and allows the migration of the product to newer technologies such as hand-held devices, without a major rewrite of the software.

Several tools are compiled into the sequencer and can optionally be displayed to the operator based upon an entry in the policy table.

A Structured Query Language (SQL) to Extensible Markup Language (XML) conversion tool is used to rapidly convert SQL database elements into an XML format which the sequencer can utilize. This allows the sequencer to utilize data, which is stored in a relational database without having to have a database server present.

A Talk/Listen panel allows procedure writers to communicate with instruments without the need to execute a procedure. This ability is particularly important when constructing and testing newly developed modules.

A Device Manager allows a developer to take the sequencer in and out of simulated mode. Simulated mode provides the ability to execute a procedure without any test equipment present on the bus. Where commands are sent to a device in simulated mode, the command is rendered to the screen as text. When a device is queried in simulated mode, the developer is provided an input box, the results of which are sent back to the sequencer.

The sequencer includes a test mode. The test mode allows a previous calibration run to be re-created without the need for any test equipment on the bus. The results captured by the sequencer at run time include a log file of each and every command sent to each device and their responses. The test mode essentially feeds this log back into the sequencer during procedure execution. The result is that the entire calibration event, including all responses from the operator, is executed as though it were running with real equipment connected. The results can be compared to known good results to accomplish tasks such as procedure certification or quality assurance.

A key innovation to minimize the cost of supporting an organization wide base of systems is referred to as a "Stick Model." This model provides a way to utilize commercial off the shelf computers as instrument controllers while virtually eliminating the need to maintain them. These controllers can be acquired without a hard drive or installed operating system. They consist of a motherboard, memory, and CPU only. Even the power supply can be external to these devices. This both reduces costs and increases the reliability of each box as most of the high-failure components have been eliminated in the controller.

The controllers should support booting from both local area network (LAN) and from universal serial bus (USB) keys. It is important to note that the same software and operating system can be utilized when running either over the LAN or using the USB key. In both cases, when power is removed from the controller, nothing is left behind, thus there is no need to maintain the overhead associated with keeping each of these systems current.

While the RACE product is cross platform and runs under Microsoft Windows, one deployment model uses Linux as the operating system. The Linux operating system has several advantages over Microsoft Windows with respect to the present invention. First and foremost, its open design enables the removal of unneeded elements from the kernel itself. This reduces the size of the operating system and eliminates unnecessary complexity. It also allows a configuration of the system to run only the sequencer, eliminating the use of the instrument controller as a general-purpose computer in the laboratory. There is also a financial incentive to utilize Linux as it is open source and requires no per seat license fee. Finally, the security aspects of Unix style operating systems make it a good choice.

Figure 11:
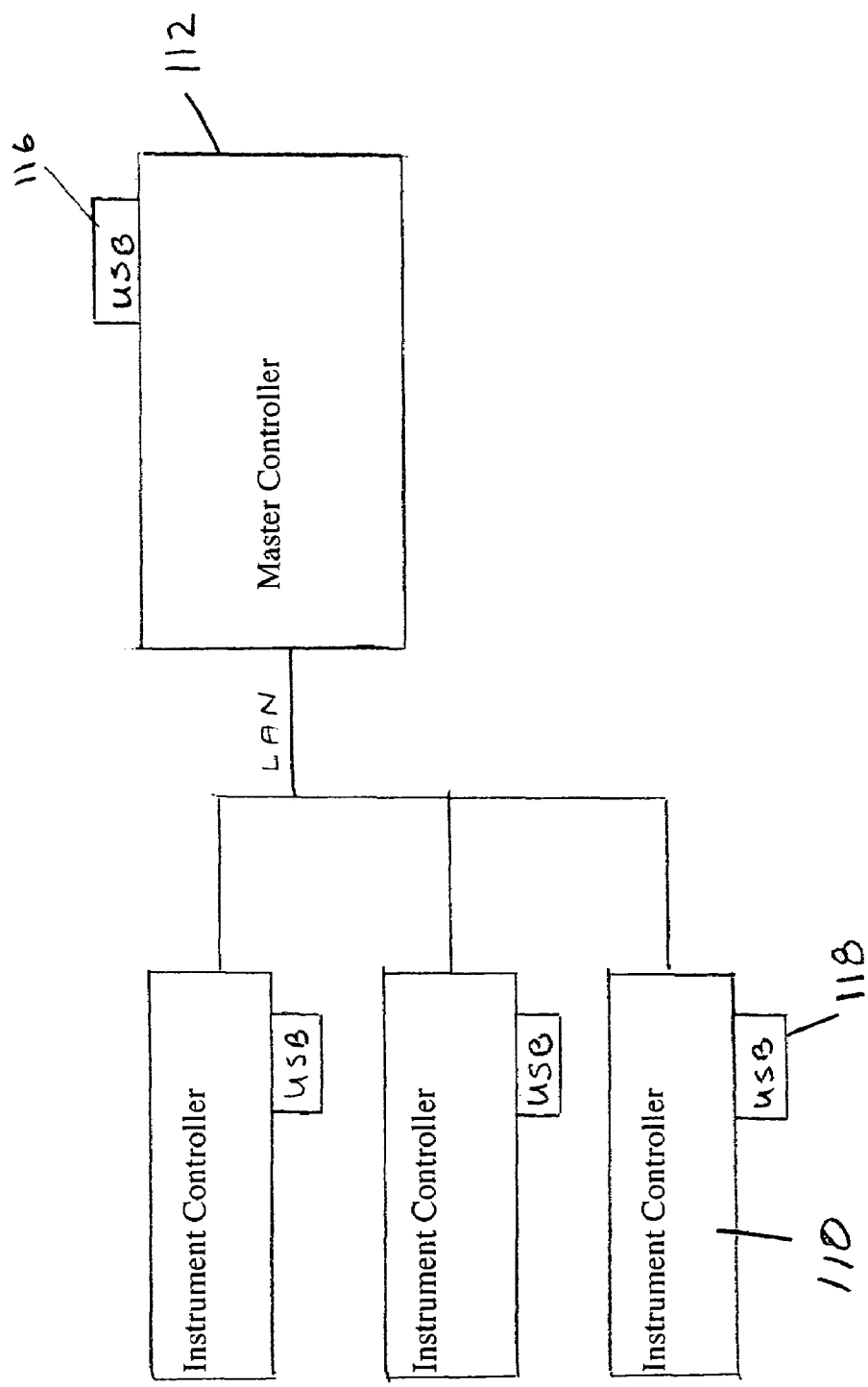
FIG. 11 is a system diagram showing LAN and USB connections from instrument controllers and a master controller.

Referring now to FIG. 11, in one embodiment, individual instrument controllers 110 are connected to a master controller 112 via LAN 114. Upon applying power to an instrument controller, the instrument controller looks for the master controller using the PXE protocol, which is now part of most modern computer BIOS implementations. When the master controller receives a request from the instrument controller, it sends the latest operating system and sequencer versions across the network. Typically, this process takes around 20 seconds. The instrument controller is then up and running the sequencer software. The user is then prompted for his or her login, and when successful, all job packages assigned to that individual are sent to the controller. Each job package contains all required elements to perform the calibration.

Once the software package has been received, the instrument controller severs its connection to the master controller until new jobs are requested, or results need to be sent back. This is significantly different from a traditional client-server model in which the application executes on the server, and the client is simply a dumb-terminal. In the Stick Model approach, the instrument controller runs the calibration software and only talks to the server as needed. This arrangement makes the design scalable, that is, additional instrument controllers can be added without incurring a performance penalty.

In another embodiment, in addition to serving up software packages to instrument controllers, which are connected via a LAN, the master controller also contains the ability to format and master non-volatile USB-key drives using a USB port 116. When a technician wishes to use an instrument controller, which does not have LAN connectivity, he or she can simply walk to the master controller and insert his or her USB-key into a USB port 118. The master controller reads the user information as well as the operating system and sequencer versions installed on the key. If either of these elements has been upgraded, the master controller updates it. Next, the results of any outstanding job are copied from the key into the master controller's database. Finally, all new jobs assigned to the technician are copied to the key.

The result is that every time a technician takes his or her key to the master controller, the key is updated to the most current versions of all software elements. Through a single database push to the master controller, an entire laboratory with all of its instrument controllers can be updated.

RACE supports displaying figures in the form of .jpg, .bmp, .png files, etc. These figures remain static in the database. This means that where figures provide detailed information specific to a standards front panel, either the same image must be displayed regardless of the standards used, or that each combination of standards in a setup would require its own figure. The invention also contemplates constructing the figures dynamically using a node map overlaid on the image itself. This reduces the number of figures procedure writers must enter into the database and decreases the development time when writing new procedures. It also means that the figures displayed to the operator will have more detail and will be relevant regardless of which standards are chosen at runtime.

The ability to provide an uncertainty of measurement for each data point is also desirable. RACE in an embodiment supports at least two different approaches to calculating and reporting measurement uncertainty. The first method requires the construction of a math model for each test point. The RACE sequencer has the ability to make multiple measurements if required. These elements combine to enable RACE to perform a traditional approach to calculating measurement uncertainty.

The second method utilizes a statistical approach utilizing the large pool of calibration results data that exists in an organization.

Procedure Editor

Calibration procedures usually consist of four main sections:

Section 1: Test Instrument Calibration Requirements

Section 2: Calibration Standards Requirements

Section 3: Preliminary Equipment Setup

Section 4: Calibration Process

Figure 6:
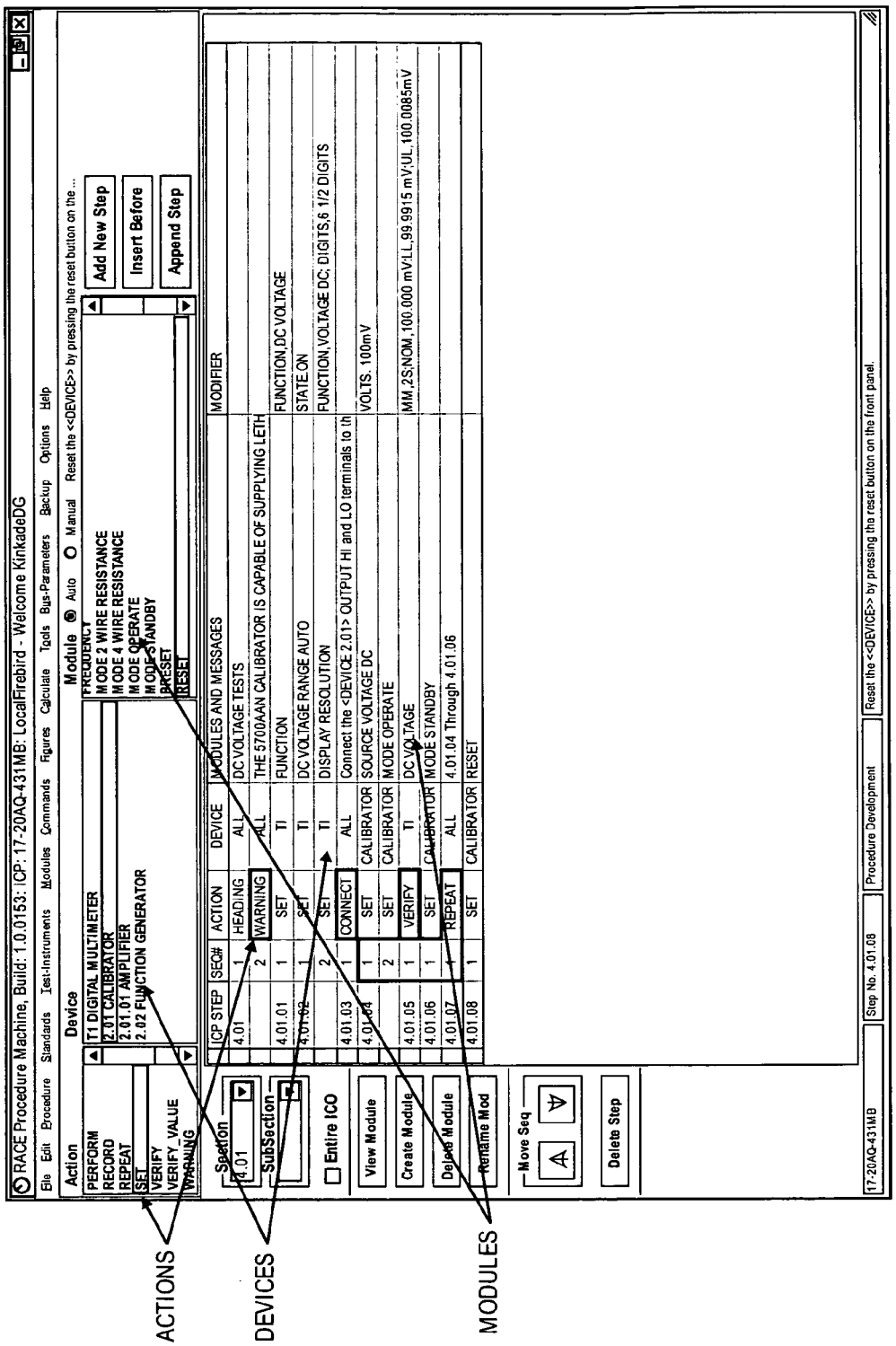
FIG. 6 is a screen shot showing the procedure of FIG. 5 when entered in the RACE Procedure Machine (RPM).

A portion of a Section 4 test section from a calibration procedure for a Digital Multimeter is shown in FIG. 5. The same procedure as entered in the RACE Procedure Machine (RPM) is shown in FIG. 6.

Procedure Actions

The procedure consists of a sequence of ACTIONS that correspond to the type of actions in the manual procedure. For this example, the actions entered are:

HEADING

WARNING

SET

CONNECT

VERIFY

REPEAT

The HEADING, WARNING, and CONNECT actions have messages for the calibration technician that go along with them. The SET action is used to send bus commands to the instruments, or in manual mode, provide instructions to the calibration technician on how to setup the instrument. The VERIFY action compares a measured result value to tolerances for in-tolerance and out-of-tolerance testing.

Procedure Devices

The DEVICES are generic references to a specific model number. For this example, the CALIBRATOR (see FIG. 6) refers to a Fluke model 5700A Calibrator. Standards can be easily substituted without making modifications to the procedure. Standards substitution is accomplished by providing another device with the same modules. For example, if the Fluke 5520A Calibrator were to be substituted for the 5700A, then for this example section, four modules would have to be created to match the 5700A modules:

SOURCE VOLTAGE DC

MODE OPERATE

MODE STANDBY

RESET

Repeat Action

Figure 7:
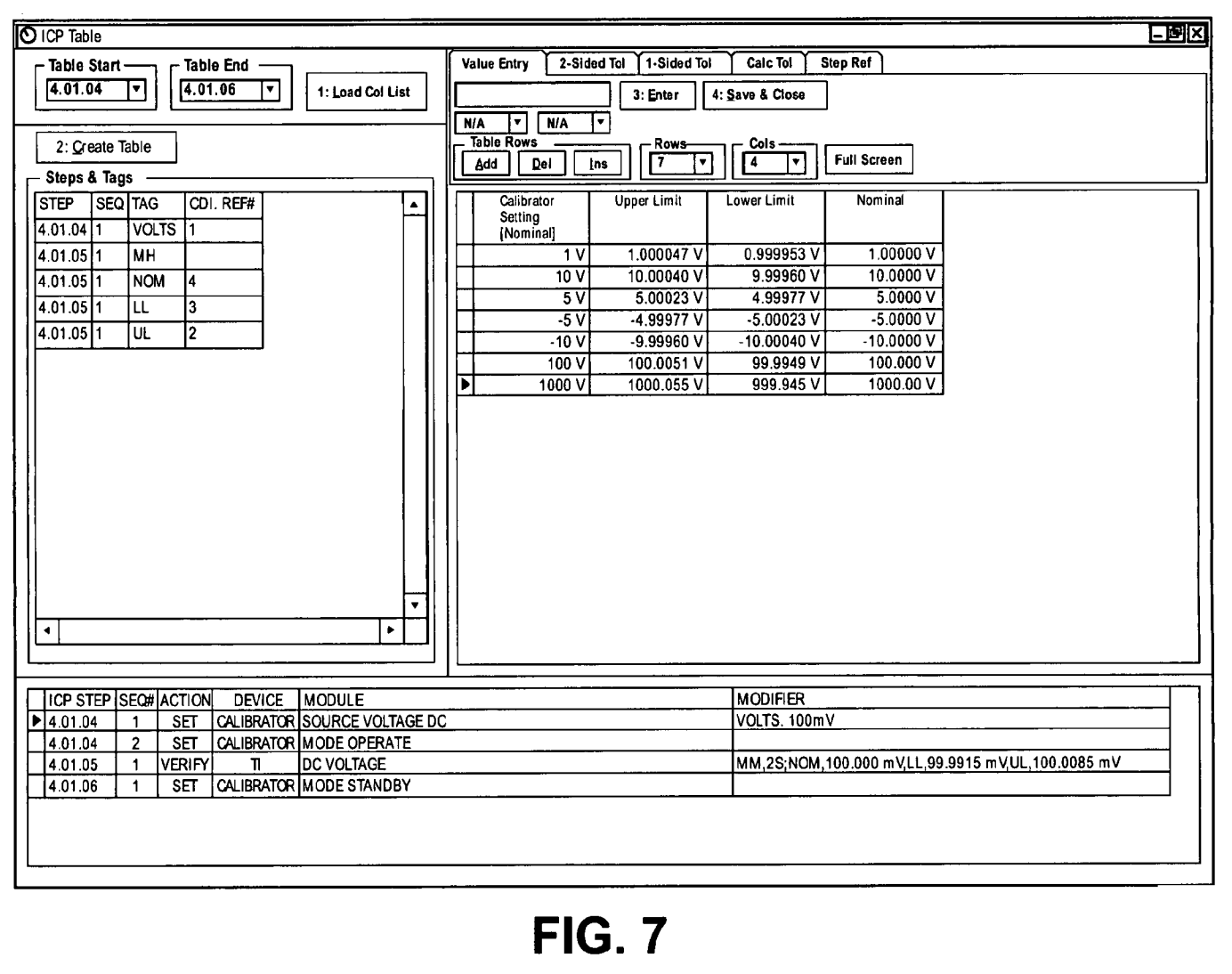

The REPEAT action is used to repeat a section of the procedure. A table of information is associated with the REPEAT action. This table holds a list for the parameters that require new values when the procedure step is repeated. For example the CALIBRATOR voltage changes for each loop of the REPEAT action and the tolerance changes as shown in FIG. 7.

Instrument Commands

Figure 8:
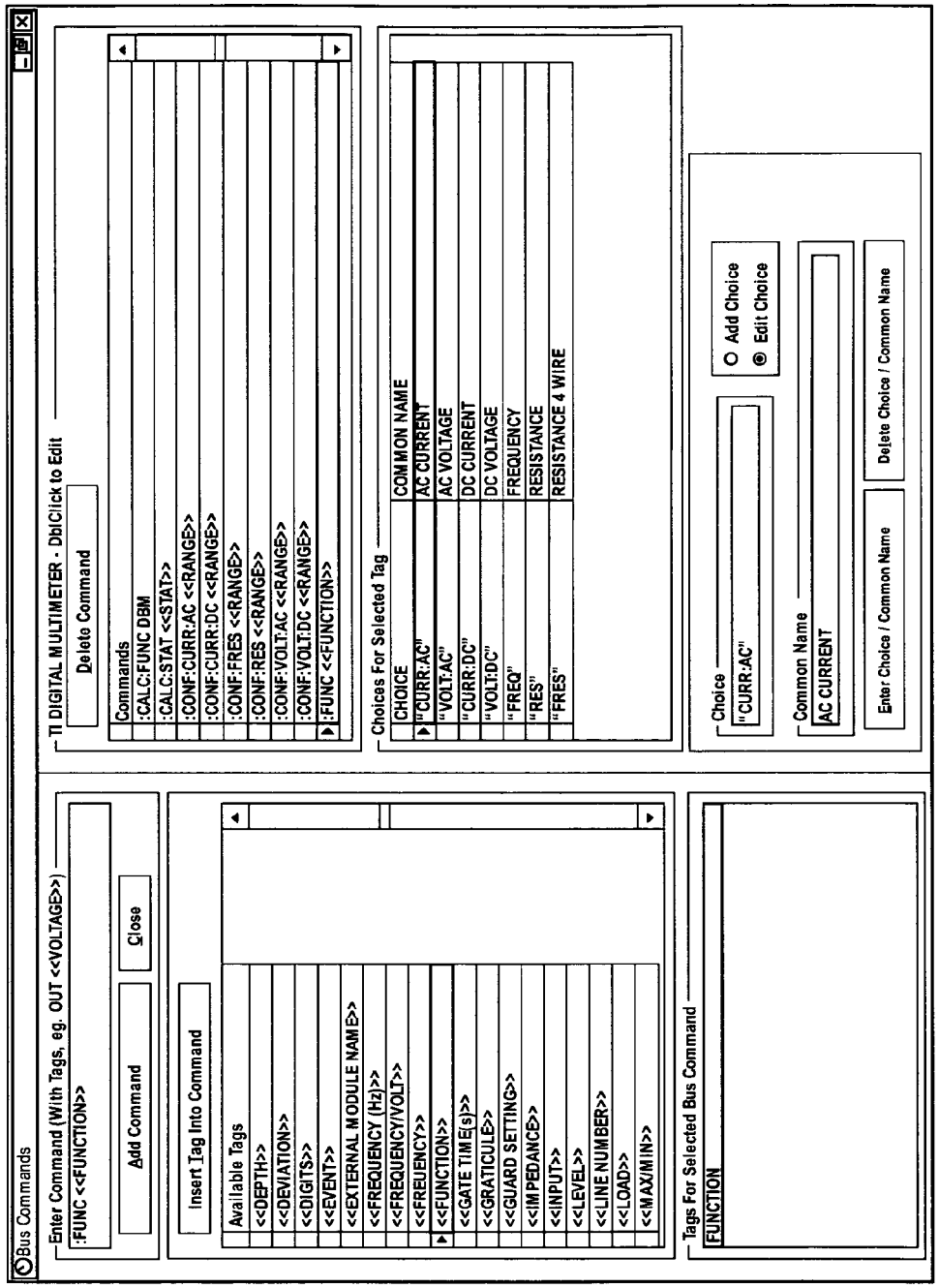
FIG. 8 is a screen shot showing the procedure editor screen for entry and editing of automated commands for devices.

Modules consist of a sequence of commands. There are a sequence of manual commands and a sequence of automated commands. FIG. 8 shows the procedure editor screen for entry and editing of the automated commands for devices.

Device tags are used for choices from a list or a value. The tag is substituted with the choice selected by the procedure writer from the list of choices or a value typed in. For the example above, the tag <<FUNCTION>> has a list of choices associated with it. These choices are presented to the procedure writer using an easier to understand 'Common Name'. For the example, if the procedure writer selects from the list of common names the choice 'DC VOLTAGE' the bus command to the instrument would be :FUNC "VOLT: DC". Procedure writers do not require any knowledge of a programming language to enter the bus commands. Tags are also used for value entry. For example the tag <<FREQUENCY>> can be used to prompt the procedure writer to enter a frequency value such as 100 MHz. This value is then substituted into the bus command replacing the tag.

Figure 9:
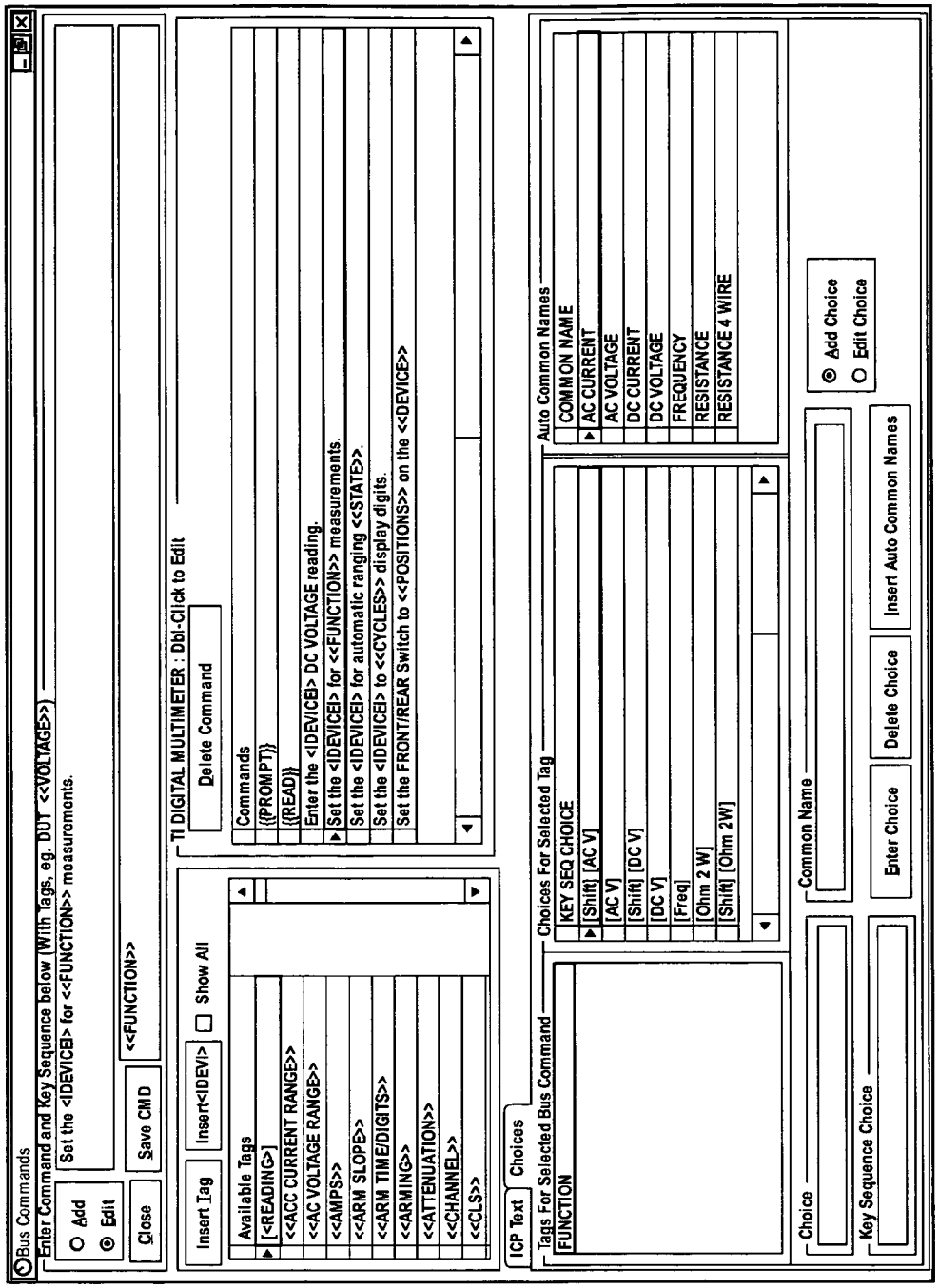
FIG. 9 is a screen shot showing the manual command entry screen.

For manual control of devices there is a corresponding manual command entry screen as shown in FIG. 9.

Manual commands provide instructions for the calibration technician to setup the instrument manually instead of using the bus. Manual commands have an additional field to add the key sequence needed to setup the instrument for the command.

Instrument Modules

Figure 10:
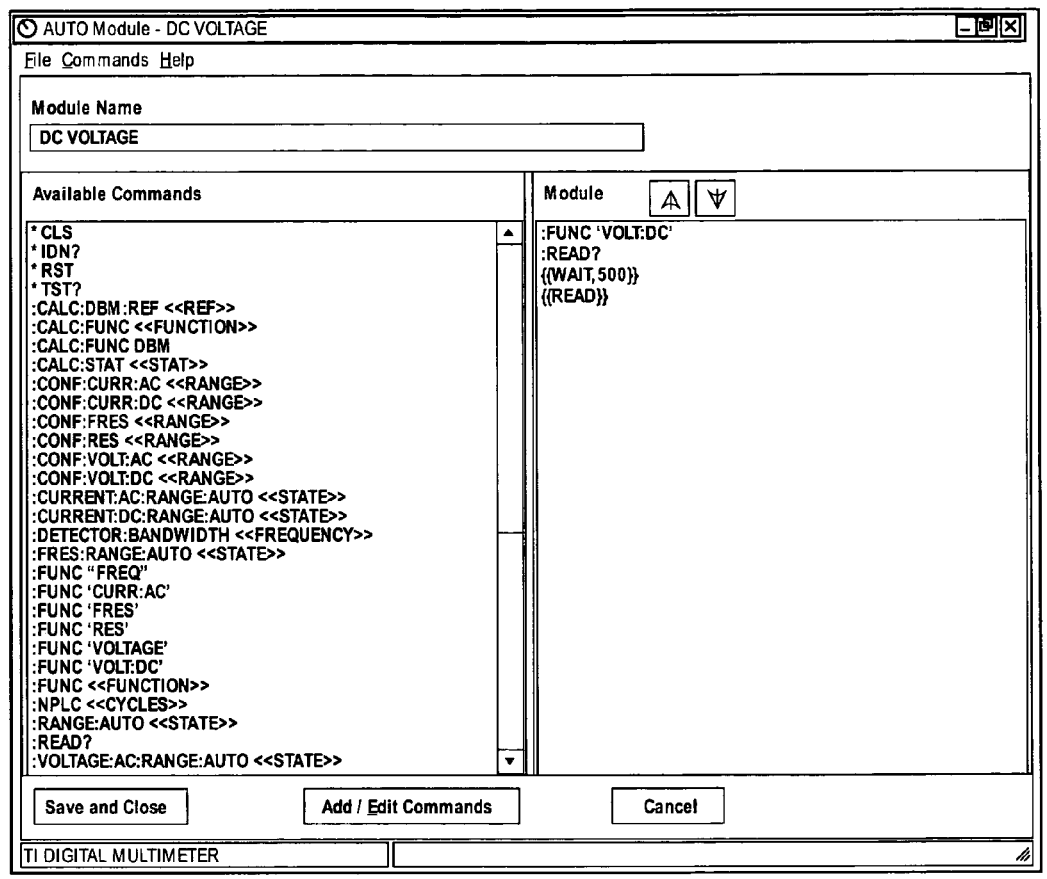
FIG. 10 is a screen shot showing the Verify module DC voltage screen.

As mentioned earlier, modules (see FIG. 6) are a series of commands that are listed in order of execution. The VERIFY module DC VOLTAGE shown in FIG. 10 sets the instrument to measure DC Voltage and reads a value back.

The invented system has leveraged from automated calibration systems developed in the past to provide the following benefits for calibration procedure development:

Manual and automated procedures stored in a single database

Automated procedure development using non-programmers

Procedure standards substitution capability

RACE provides mechanisms to standardize the level of service provided by the calibration process while eliminating technical shortcuts and increasing the overall efficiency. Through the use of the RACE editor, metrology engineers are able to rapidly convert existing calibration procedures to a format which can be rendered automated, semi-automated, or even manually. Procedure elements are stored in a relational database format, which facilitates reuse of procedure elements.

RACE's ability to provide standard substitution eliminates the need for multiple procedures to exist for the same piece of test equipment. Storing instrument commands and functions in a relational database, not only ensures their availability in additional procedures, but also provides a way to systematically migrate existing procedures forward as improvements to the architecture are made.

We claim:

1. A system including an instrument controller for automating calibration of test instruments, said instrument controller comprising:
   a computer having a processor and memory;
   a relational arrangement of calibration procedure elements arranged in a database structure, said database structure stored in said memory;
   a sequencer executing said calibration procedure elements using said computer;
   an interface for connecting said computer to a corresponding instrument interface;
   said system further including a master controller having current versions of said database structure and said sequencer; and
   an interface for providing said current versions from said master controller to at least one said instrument controller.

2. The system defined by claim 1 wherein said relational arrangement of calibration procedure elements comprise instrument commands and instrument functions.

3. The system defined by claim 1 wherein said sequencer selectively operates in a simulation mode.

4. The system defined by claim 1 wherein said sequencer selectively operates in a test mode.

5. The system defined by claim 1 wherein said at least one instrument controller is bootable from each of a local area network and from a universal serial bus key.

6. The system defined by claim 5 wherein said master controller provides said current versions of said database structure and said sequencer to said at least one instrument controller using said local area network.

7. The system defined by claim 5 wherein said master controller provides said current versions of said database structure and said sequencer to said at least one instrument controller using said universal serial bus key.

* * * * *